(12) United States Patent
Bailey et al.

(10) Patent No.: US 7,072,820 B1
(45) Date of Patent: Jul. 4, 2006

(54) ACCESSING STATE INFORMATION IN A HARDWARE/SOFTWARE CO-SIMULATION

(76) Inventors: Brian Bailey, 20444 S. Jasan Dr., Oregon City, OR (US) 97045; Michael C. Brouhard, 620 Atwater Rd., Lake Oswego, OR (US) 97034; Jeffry A. Jones, 2453 S. Marylhurst Dr., West Linn, OR (US) 97068; Devon J. Kehoe, 4940 SW. Joshua Ct., Tualatin, OR (US) 97062

( * ) Notice: Subject to any disclaimer, the term of this patent is extended or adjusted under 35 U.S.C. 154(b) by 733 days.

(21) Appl. No.: 09/587,496

(22) Filed: Jun. 2, 2000

(51) Int. Cl.
G06F 17/50 (2006.01)
G06G 7/62 (2006.01)

(52) U.S. Cl. .......................... 703/17; 703/13; 703/19; 716/3; 716/18

(58) Field of Classification Search .................. 703/13, 703/17, 19; 716/3, 18
See application file for complete search history.

(56) References Cited

U.S. PATENT DOCUMENTS

| | | | | |
|---|---|---|---|---|
| 5,768,567 A | * | 6/1998 | Klein et al. | 703/13 |
| 5,771,370 A | * | 6/1998 | Klein | 703/13 |
| 6,009,256 A | * | 12/1999 | Tseng et al. | 703/13 |
| 6,026,230 A | * | 2/2000 | Lin et al. | 703/13 |
| 6,134,516 A | * | 10/2000 | Wang et al. | 703/27 |
| 6,212,489 B1 | * | 4/2001 | Klein et al. | 703/13 |
| 6,230,114 B1 | * | 5/2001 | Hellestrand et al. | 703/13 |

(Continued)

OTHER PUBLICATIONS

Heimbigner, D. "The ProcessWall: A Process State Server Approach to Process Programming." Proc. of the 5th ACM SIGSOFT Symposium on Software Development. 1992. pp. 159-168.*
Both, A. et al. "Hardware-Software-Codesign of Application Specific Microcontrollers with the ASM Environment." Proc. of the Conf. on European Design Automation. 1994. pp. 72-76.*
Zitouni et al. "Communication Synthesis Approach for Distributed Systems and Its Application During the Design of a Communication Controller." Proc. of the $10^{th}$ Int'l Conf. on Microelectronics, 1998. Dec. 1998. pp. 249-252.*
Eisenring, M. et al. "Domain-Specific Interface Generation from Dataflow Specifications." Proc. $6^{th}$ Int'l WOrkshop on WH/SW Codesign, 1998 (CODES/CASHE '98). pp. 43-47.*
Microsoft Press Computer User's Dictionary (1998). pp. 133, 315, 328.*

Primary Examiner—Paul L. Rodriguez
Assistant Examiner—Ayal Sharon
(74) Attorney, Agent, or Firm—Klarquist Sparkman, LLP (57) ABSTRACT

A hardware/software co-simulation permits access to a server state from any process in the hardware/software co-simulation. In one embodiment, a co-simulation interface receives a request from a client system for configuration data for the server state in of the hardware/software co-simulation. The configuration data defines memory locations in the co-simulation from which the server state can be assembled. The interface inserts the request in the co-simulation. The co-simulation responds with the configuration information. Based on the configuration information, memory operations can be performed on the server state.

27 Claims, 6 Drawing Sheets

U.S. PATENT DOCUMENTS 6,263,302 B1 * 7/2001 Hellestrand et al. .......... 703/17
6,321,366 B1 * 11/2001 Tseng et al. .................... 716/6
6,389,379 B1 * 5/2002 Lin et al. ....................... 703/14
6,421,251 B1 * 7/2002 Lin ............................. 361/788
6,651,225 B1 * 11/2003 Lin et al. ....................... 716/4
2001/0011210 A1 * 8/2001 Bailey ......................... 703/17

* cited by examiner

ACCESSING STATE INFORMATION IN A HARDWARE/SOFTWARE CO-SIMULATION

FIELD OF THE INVENTION

The present invention pertains to the field of electronic design automation (EDA). More particularly, this invention relates to accessing state information within a hardware/software co-simulation EDA environment.

BACKGROUND OF THE INVENTION

Electronic design automation (EDA) has long been used to design electronic hardware such as integrated circuits. Increasingly, however, new designs have both a hardware component and a software component. For instance, an "embedded" system often includes a special-purpose hardware component that is installed in a general-purpose computer system. A software component is developed to execute on one or more processors in the computer system to allow the computer system to interact with the installed hardware component.

One familiar example of an embedded system is a "software" modem. A software modem uses the processing power of a computer system to process data traffic. A software modem only needs enough special-purpose hardware to pass data back and forth between the computer system and a telephone network. As with most embedded systems, the special-purpose hardware can be significantly simplified compared to a typical hardware device designed for the same purpose, usually resulting in smaller components and a lower price point.

Although there are numerous advantages to embedded systems, designing hardware and software components to work together is no trivial matter. Ideally, hardware is simulated and verified before a physical prototype is produced. A logic simulator works well for simulating hardware, but does not work well for simulating software execution in hardware. Under most circumstances, even the fastest logic simulators can only simulate execution of a few software instructions every second. Given that a processor may execute hundreds of thousands or even millions of instructions per second, simulating software execution using a logic simulator is often simply too slow to be useful.

An instruction set simulator (ISS) is often used to simulate software execution in a known execution unit such as a particular general purpose microprocessor or a particular digital signal processor. A typical ISS can execute instructions at a speed much closer to that of a known device being simulated. An ISS, however, only simulates the behavior of software executing on a known device. That is, for a hardware/software design embedded in a computer system, an ISS can simulate a general-purpose processor executing the software, but the ISS cannot simulate the interaction between the general-purpose processor and the special-purpose hardware.

Hardware/software co-simulation often combines a logic simulator with an ISS. The logic simulator is used to simulate the hardware component and the ISS is used to simulate execution of the software component. In most embedded designs, only a small fraction of software instructions require interaction with the special-purpose hardware. In which case, by combining an ISS and a logic simulator, the majority of software instructions can be executed at high speed by the ISS. The combined simulation only needs to slow down to the speed of the logic simulator when the simulation involves interaction with the special-purpose hardware.

Other techniques can also be used to simulate software execution such as Host Code Execution where the embedded code runs on the native host machine, or abstract software executing in a dedicated software simulation environment. Similarly the hardware can exist at many different levels of abstraction.

Although hardware/software co-simulation can significantly increase the operating speed of a simulation, the two simulation environments are typically viewed from very different perspectives. For instance, the state of software is often viewed by checking the values of variables at various stages during execution in a debugger. The state of hardware is often viewed by tracing values of registers or memory locations over time. A variable in software generally does not map directly to a register or memory location in hardware. The different perspectives make it difficult to form a coherent understanding of how a hardware/software co-simulation is operating and how a hardware/software co-simulation can or should be modified.

BRIEF DESCRIPTION OF THE DRAWINGS

Examples of the present invention are illustrated in the accompanying drawings. The accompanying drawings, however, do not limit the scope of the present invention. Similar references in the drawings indicate similar elements.

DETAILED DESCRIPTION

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and other otherwise manipulated through, for instance, electrical components.

Various operations will be described as multiple discrete steps performed in turn in a manner that is helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

The present invention seeks to improve the utility of hardware/software co-simulation by providing a more coherent view of a simulated design. In particular, as discussed more fully below, various embodiments of the present invention allow state information to be accessed from any process of a hardware/software co-simulation. Embodiments of the present invention can be applied to hardware and software components modeled at any level of abstraction. In fact, the techniques described below can be applied to functionality that has not yet been partitioned into separate hardware and software components.

A specific example of the present invention is described below in which state information is accessed from a hardware simulation process in a hardware/software co-simulation. Accessing the state of software from a hardware process in a hardware/software co-simulation depends on how a particular execution device (microprocessor, digital signal processor, etc.) handles memory. A typical execution device defines a memory space for storing information associated with the execution device. The memory space is mapped to memory locations in memory devices. The mapping can be quite complex.

For instance, a microprocessor may have a 32 bit data bus. Memory devices that the microprocessor uses may have 8 bit data buses. If 8 bit memories are used, a single address in the microprocessor's address space may map to four 8 bit memory locations in the memory devices. If four 8 bit memory devices are addressed in parallel, 32 bits of data can be accessed simultaneously. For example, the lowest 8 bits of a 32 bit data segment in the microprocessor's memory space can be mapped to one memory location in one memory device, the second 8 bits can be mapped to a second memory location in a second memory device, and so on for the third and fourth memory devices.

Any number of alternate mapping techniques are possible. If, for instance, memory devices are interleaved, the 8 data bits of a first memory device may be mapped to data bits 1, 5, 9, 13, 17, 21, 25, and 29 of an address in the microprocessor's memory space, the 8 bits of the second memory device may be mapped to data bits 2, 6, 10, 14, 18, 22, 26, and 30, and so on for the third and fourth memory devices. In other examples, microprocessors may have even wider data buses, such as a 64 bit bus, and memories may have smaller data buses, such as 1 or 2 bit buses, in which case many memory locations may be mapped to a single address in the address space of a microprocessor.

Another degree of complexity is added to the mapping between software and hardware state by the "symbol table." Software is written in a programming language that needs to be compiled by a compiler before it can be executed on a processor. Part of the job of a compiler is to allocate symbols to addresses. A symbol table records this relationship of symbols to addresses. For instance, a 64 bit variable may be allocated in a symbol table to two addresses in a 32 bit memory space. If each memory location in the 32 bit address space is mapped to four 8 bit memory devices as discussed above, eight different memory locations in hardware will be needed to represent a 64 bit software variable.

Furthermore, each time software is compiled, the compiler may allocate symbols to different addresses, changing the symbol table. Software is usually re-compiled every time the software is changed. Since software design and verification often involves many software changes and re-compiles, the allocation of symbols to addresses can change frequently. These frequent changes further compound the complexity of mapping between software and hardware.

A symbol table also defines symbol types. For instance, a variable may be an integer, real number, Boolean, etc. In which case, the data bits occupying a particular address in the memory space of an execution device need to be interpreted according to the type of variable in order to provide meaningful data.

Memory space mapping, symbol table allocation, and symbol type all need to be used together to read the value of a software variable stored in memory. In other words, to access a software state from a hardware process of a hardware/software co-simulator, one or more memory addresses corresponding to the software state need to be identified, one or more memory locations need to be accessed based on the address(es), data bits occupying the memory location(s) need to be assembled in a particular manner, and the assembled data need to be interpreted according to the type of variable.

Figure 1:
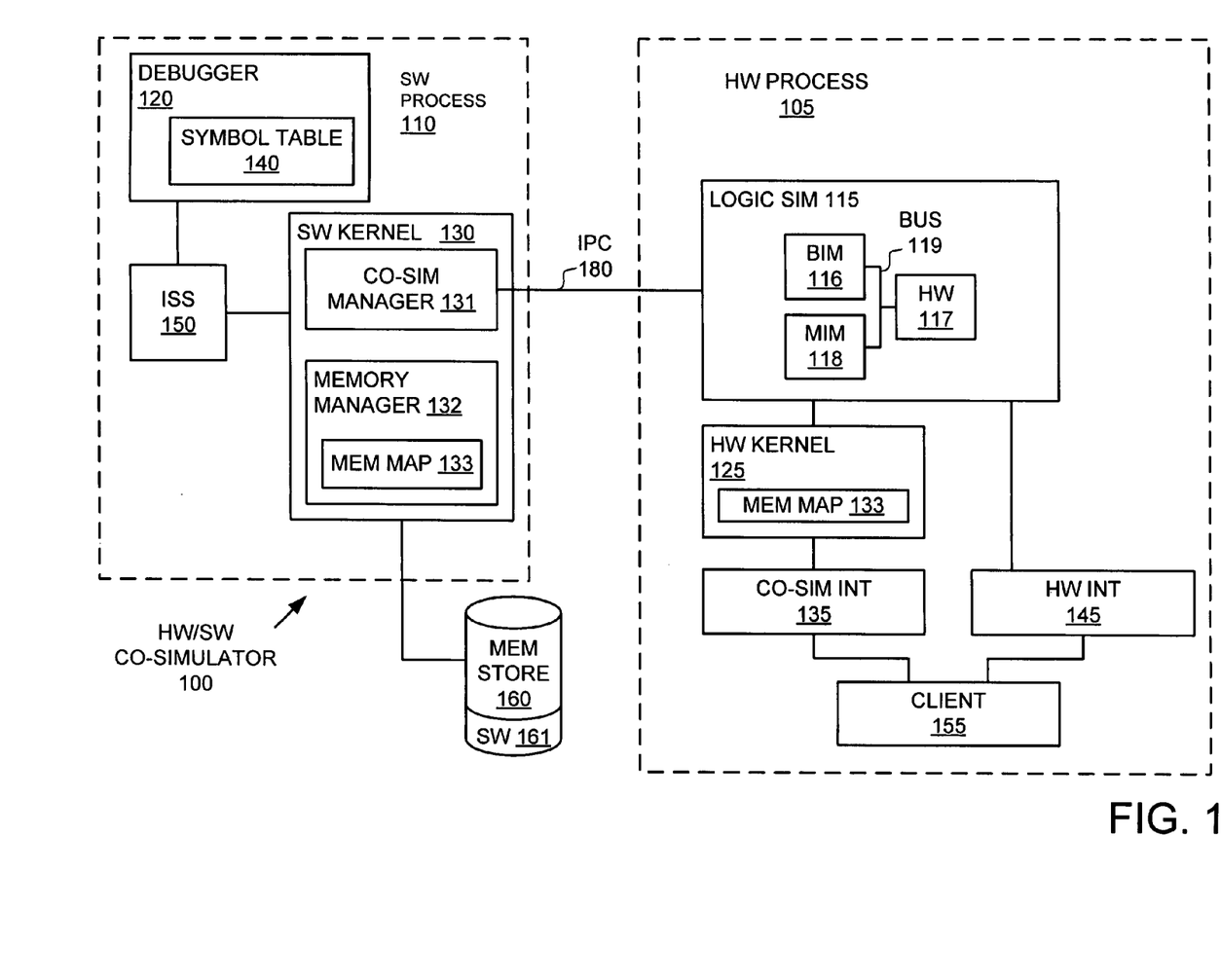
FIG. 1 illustrates one embodiment of a hardware/software co-simulator according to the teachings of the present invention.

FIG. 1 illustrates one embodiment of a hardware/software co-simulator 100 according to the teachings of the present invention. An embedded system simulated by hardware/software co-simulator 100 includes a software component 161 and a hardware component 117. The other components in FIG. 1 are used to model and manage known devices such as processors, memories, buses, etc. The embodiment of FIG. 1 illustrates a number of components commonly found in a hardware/software co-simulation. An overview of the illustrated embodiment will assist in understanding the teachings of the present invention.

Co-simulator 100 simulates a microprocessor, some memory devices, and special-purpose hardware 117. The simulated microprocessor executes software 161 stored in the simulated memory devices. Since simulating software execution by a microprocessor would often be excessively slow in logic simulator 115, the microprocessor is primarily simulated in software process 110. Interprocess communication (IPC) link 180 couples software process 110 to hardware process 105 to allow the two processes to communicate.

Instruction set simulator (ISS) 150 and bus interface model (BIM) 116 together simulate the microprocessor. ISS 150 executes instructions as if the instructions were executed by a particular type of microprocessor. BIM 116 represents the input and output behavior of the simulated microprocessor as pin signals on bus 119 in logic simulator 115.

Memory interface model (MIM) 118 and memory store 160 together simulate the memory devices. MIM 118, like BIM 116, represents the input and output behavior of the memory devices in logic simulator 115. In various embodiments, MIM 118 may represent multiple separate memory interface modules, one for each separate simulated memory device.

To read an instruction from memory, ISS 150 can send a request to BIM 116 through software kernel 130. BIM 116 will assert the appropriate pin signals in logic simulator 115 over bus 119 to MIM 118. MIM 118 will recognize the pin signals and send the appropriate memory request on to memory store 160 through hardware kernel 125. Memory store 160 will return the requested data through MIM 118, over bus 119, through BIM 116, and back to ISS 150.

Of course, forcing ISS 150 to read and write to memory through logic simulator 115 may be unnecessarily slow. One of the functions of co-simulation manager 131 in software kernel 130 is to monitor bus transactions from ISS 150. If bus transactions are deemed unnecessary for the correct operation of the hardware, there is no need to simulate the bus transactions in logic simulator 115. Instead, co-simulation manager 131 can perform bus transactions entirely within software process 110 more quickly by directly sending transactions to memory store 160 through memory manager 132.

Memory store 160 provides a single, coherent view of memory to both software process 110 and hardware process 105. So, for instance, if ISS 150 stores data to memory store 160 within software process 110, hardware 117 can access the stored data from hardware process 105 through MIM 118.

Memory manager 132 manages access to memory store 160 from software process 110. Hardware kernel 125 manages access to memory store 160 from hardware process 105. Both memory manager 132 and hardware kernel 125 have a copy of memory map 133. Memory map 133 maps addresses to simulated memory devices. For example, if the system being simulated includes a 32 bit address space, and the memory devices being simulated are 8 bit memory devices, memory map 133 is configured to simulate the mapping of each address of the 32 bit address space to four 8 bit memory locations.

Memory store 160 and memory map 133 may represent multiple address spaces. For instance, in an alternate embodiment that includes multiple simulated execution devices (such as multiple ISS and BIM combinations), each execution device may define one or more address spaces. Any number of addressing schemes can be used to delineate various address spaces. In one embodiment, a file structure is used in which each file corresponds to a different address space.

In one embodiment, memory map 133 is created and maintained when co-simulator 100 is configured. Any number of approaches can be used to configure co-simulator 100 to simulate various address spaces.

Debugger 120 can be used to keep track of software execution in ISS 150. Debugger 120 also maintains symbol table 140. As discussed above, symbol table 140 specifies symbol types for variables and specifies addresses allocated to each variable in the memory space of the microprocessor being simulated by ISS 150.

Except for the teachings of the present invention, co-simulator 100 is intended to represent a broad category of hardware/software co-simulators known in the art. Those skilled in the art will recognize that alternate embodiments of co-simulator 100 may include additional components, may include fewer components or combinations of components, and may include components organized in any variety of architectures. For instance, alternate embodiments of logic simulator 115 may simulate a more complex bus architecture including components such as bus bridges to additional buses, direct memory access controllers, additional memory or additional MIMs. Any number of software model interfaces can be used for BIM 116 and MIM 118. Any number of communication links can be used for IPC 180.

As stated above, configuration information including memory mapping, symbol allocation, and symbol type are all needed to assemble a software state. In the past, a client in hardware process 105, such as client 155, could not access the software state of a client in software process 110, such as ISS 150. That is, even though memory store 160 provides a single coherent view of memory to both software process 110 and hardware process 105, client 155 only had access to memory map 133 and did not have access to the rest of the state configuration information (symbol allocation and symbol type) in symbol table 140 defined by ISS 150. Embodiments of the present invention, however, make it possible to access a software state from a hardware process in a hardware/software co-simulation.

Moreover, embodiments of the present invention allow any co-simulation client to access any state information that any other co-simulation client exposes in the form of software state. For instance, alternate embodiments of the co-simulator illustrated in FIG. 1 may include additional ISS/BIM combinations to represent additional execution devices such as microprocessors or digital signal processors, as well as a variety of generic co-simulation clients such as a User Interface visualization package, a high level system simulator, or an arbitrary block of 'C' code that provides a model of some part of the end user's system functionality.

Each execution device and/or generic client may define its own address space and symbol table for state information stored in memory. Clients that would not normally define an address space can create a virtual address space. A virtual address space can be populated with any number of symbols and corresponding addresses such that addresses are allocated for any state information that a client wishes to expose to other clients of the simulation. Clients that expose state information in this way, including ISS's, are referred to as "state servers."

In various embodiments, the present invention retrieves the state configuration information (such as memory allocation and symbol type) from a state server and provides other clients access to the corresponding software states stored in memory based on the retrieved configuration information.

Any of a variety of devices or tools which can make use of software state information can benefit from the present invention. One example of such a tool is a test bench generator. A test bench generator can be used to create various kinds of input to the hardware and/or software components being simulated, and/or to verify the correct output of these components. For instance, if the embedded system being simulated in simulator 100 is a software modem, hardware 117 could be an application specific integrated circuit (ASIC) that sends and receives digital data internal to the simulated computer system, and receives and sends corresponding analog signals from an external telephone network. In which case, a test bench generator could be used to simulate various types of line noise, lost data, and connection failures on the external telephone network.

In order to perform certain tests on the software and hardware components of the software modem, the test bench generator may need to track or manipulate one or more variables in the software and apply stimulus to them at particular times based on the complete system state. For instance, at certain instances during a modem session, modems on either end of the connection exchange various types of configuration information. Monitoring a software variable may be the only way to detect when configuration information is being exchanged. In which case, to test how a software modem responds to lost configuration information, the test bench generator would need to be able to monitor the software variable and simulate lost data when the software variable indicates configuration information is being exchanged. The present invention makes this sort of test possible.

Figure 2:
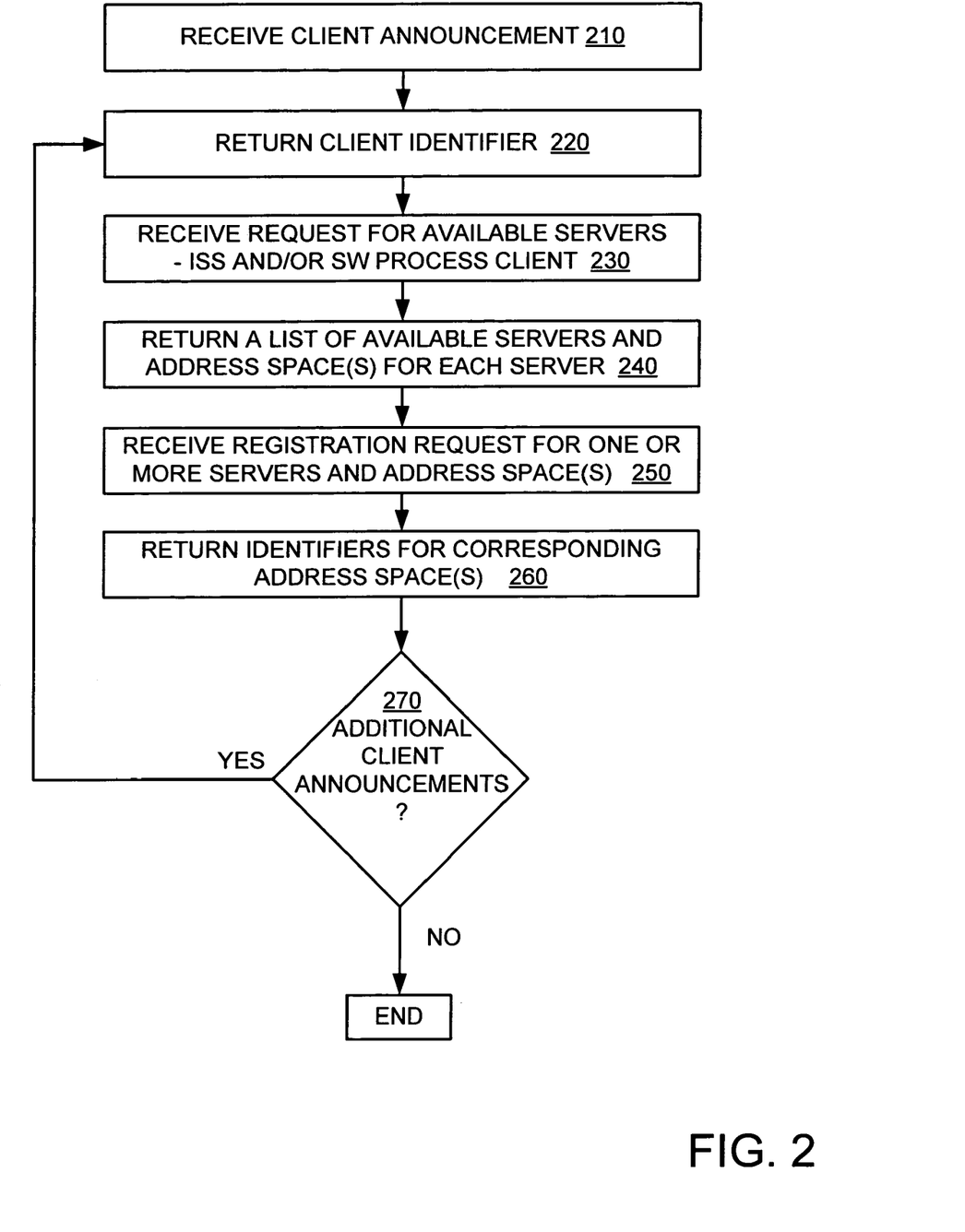
FIG. 2 demonstrates one embodiment of registering clients.
Figure 3:
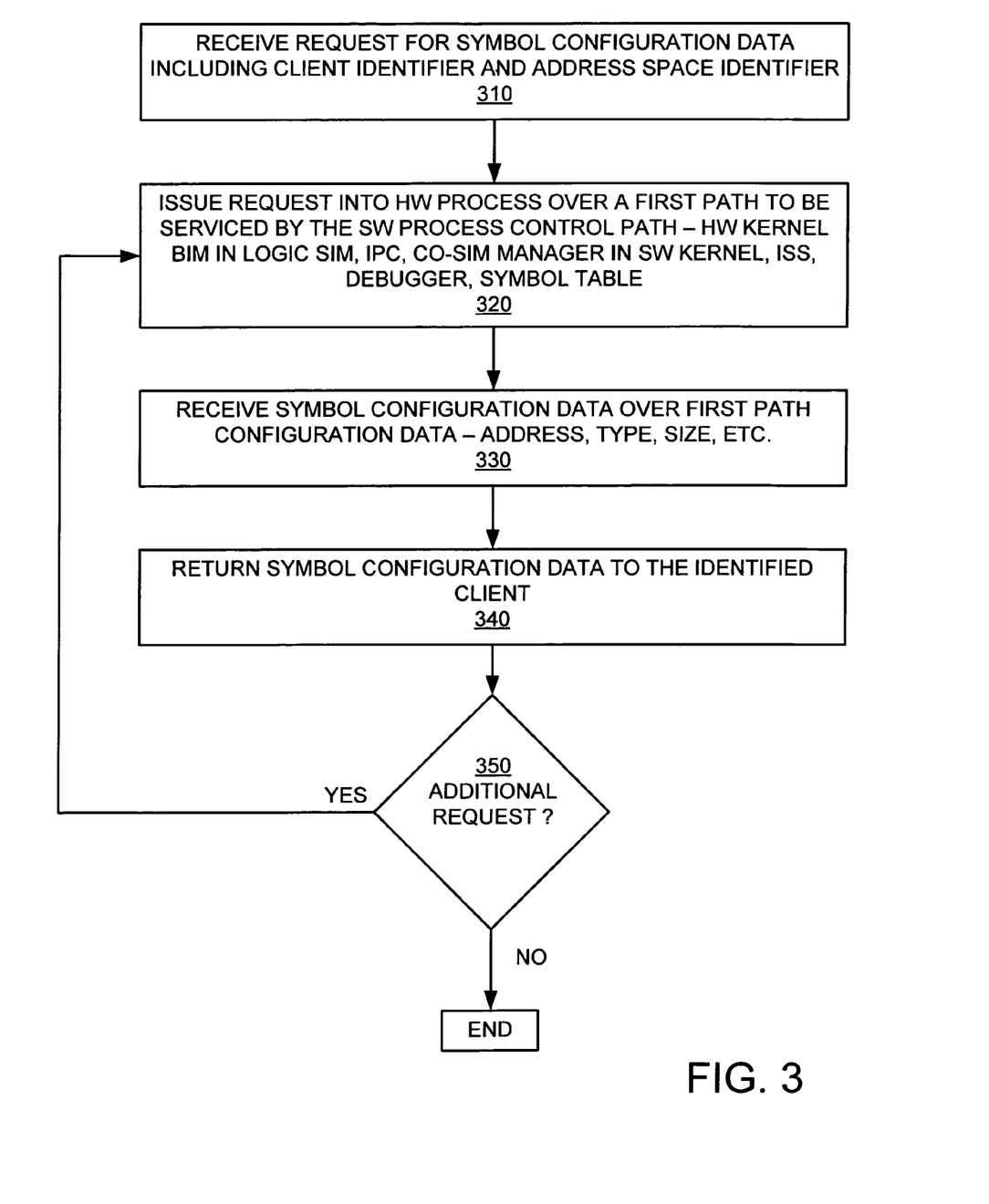
FIG. 3 demonstrates one embodiment of accessing software state configuration data.
Figure 4:
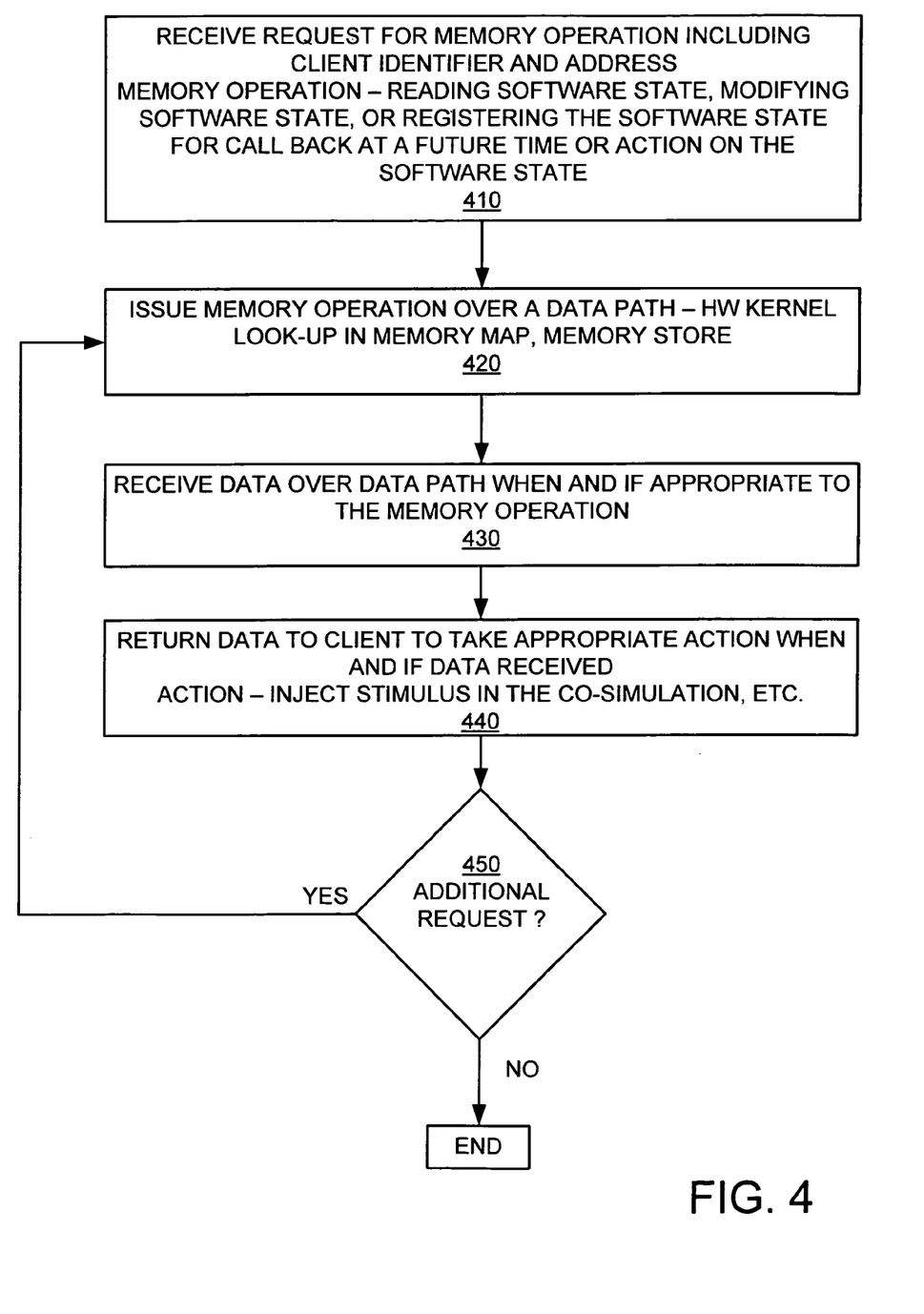
FIG. 4 demonstrates one embodiment of accessing a software state.

FIGS. 2–4 illustrate various embodiments of the present invention in more detail. For the purposes of demonstration, each embodiment illustrates the present invention from the perspective of a co-simulation interface, such as interface 135.

FIG. 2 illustrates one embodiment of registering clients for access to software state information. In block 210, a client announcement is received. That is, a client announces to the co-simulation interface that it exists.

In block 220, the co-simulation interface returns a client identifier to the client. For instance, several different clients may be coupled to one interface, such as a test bench generator, a graphical user interface, and a hardware design language (HDL) tool. Each client will be given a different client identifier to use in future interactions.

In block 230, the co-simulation interface receives a request from an identified client for a list of available state servers of the simulation that define address spaces. State servers may be either in the hardware or software processes. As discussed above, "state servers," in the context of the present invention, are components that contain and export state configuration data from the servers' symbol tables that is to be made available to "clients."

State servers may include one or more ISSs, such as ISS 150 with corresponding symbol table 140 in FIG. 1, as well as a variety of generic software process clients such as those discussed above. The list of available servers may be identified when the client registers. For instance, the co-simulation interface can identify available state servers based on address spaces defined in memory map 133 in hardware kernel 125 in FIG. 1 at the time the client registers. In an alternate embodiment in which a client is seeking to access state information from a client on the software side of a co-simulation, a co-simulation interface on the software side can access memory map 133 in software kernel 130 to identify available state servers. In other words, both state servers and clients can be located on either the hardware side or the software side of the co-simulation.

In block 240, the co-simulation interface returns the list of available state serves and one or more address spaces associated with each. In various embodiments, the list may be displayed for a user.

In block 250, the co-simulation interface receives a request to register the identified client with one or more of the servers and associated address spaces. For instance, if the list of address spaces is provided to a user, the user may request access to software state information in one or more of the address spaces for one or more state servers.

In block 260, the co-simulation interface returns an identifier corresponding to the requested address space(s) for use in future communications. In block 270, if there are additional client announcements, the process returns to block 220. New clients may be created at any point in a simulation session which would cause a return to block 210.

In an alternate embodiment, a client may make just one announcement in response to which the co-simulation interface provides a client identifier, a list of available servers and address spaces, and identifiers for each address space. In which case, in order to facilitate future interaction, a client may simply retain its own client identifier and identifiers for one or more address spaces for which the client wishes to monitor software state. Any number of alternate approaches can be used to associate clients with address spaces.

FIG. 3 illustrates one embodiment of accessing server state configuration data from a hardware process. In block 310, the co-simulation interface receives a request from a client for symbol configuration data. The request includes the client identifier and the address space identifier.

In block 320, the co-simulation interface issues the request into the co-simulator to be serviced within the state server's process. The path that the request takes through the hardware/software co-simulator depends on the particular configuration of the co-simulator and the physical location of the client and the state server. Taking the embodiment of FIG. 1 as an example, there is only one server, ISS 150, and only one client, client 155. In which case, the request goes from co-simulation interface 125 to bus interface module (BIM) 116 in logic simulator 115, over interprocess communication (IPC) 180, to co-simulation manager 131 in software kernel 130, to ISS 150, and finally to debugger 120 where the request is ultimately serviced. Symbol table 140 in debugger 120 is accessed to retrieve the appropriate configuration data (memory allocation, symbol type, size, etc.) for the requested symbol. In alternate embodiments that include more than one server, the request will be accepted by the bus interface model in the logic simulator that corresponds to the appropriate server.

A response is generated including the symbol configuration data. In block 330, the symbol configuration data is received by the co-simulation interface over the same path through the co-simulator. In block 340, the configuration information is provided to the identified client. In block 350, if an additional request is received, the process returns to block 320. If an additional request is not received, the process ends. Requests can be initiated at any time in the simulation session, in which case block 310 is re-entered.

FIG. 4 illustrates one embodiment of accessing a server state from a client process based on state configuration information. In block 410, the co-simulation interface receives a request from a client to perform a memory operation on a server state. The request includes a client identifier and address(es) for the server state. Memory operations may include read operations, write operations, and/or a variety of more sophisticated operations. For instance, a call back operation may return the indicated server state at a particular time in the future, at a particular stage in the software execution, or upon some action being taken with respect to the server state. An action taken on a server state may include reading, writing, or clearing the state, or may include mathematical or logical operations such as a comparison to a threshold value or an operating range.

Another example of a memory operation is an iterative read operation. In which case, rather than receiving a call back upon some action being taken on the server state, the client can itself detects when an action has been taken on the server state based on periodic samples taken at a give frequency.

Another example of a memory operation is a memory operation that relies on more than one server state. For instance, a memory operation may request that data from one software variable be returned based on the state of another software variable.

Of course, the same results of many of these memory operations could be achieved by having the client issue multiple memory operations. For instance, having the client periodically send a read operation may be equivalent to an iterative read operation. The functionality for the various possible memory operations can be implemented any number of ways, and the functionality may be implemented in one or more of a variety of components in the co-simulator including the client itself, the co-simulation interface, the hardware kernel, and/or the memory store.

Returning to the embodiment of FIG. 4, in block 420, the co-simulation interface issues the memory operation into the local kernel process. The memory operation takes a different path than the request for configuration data. The memory store provides a unified view of the memory to both the software and hardware processes. In which case, once a client has the configuration data, the client can access the server state from any process through the direct route to the memory store.

For instance, in the embodiment of FIG. 1, the data path from co-simulation interface 135 is through hardware kernel 125 directly to memory store 160. Hardware kernel 125 accesses memory map 133 to identify the memory locations in memory store 160 that correspond to the addresses allocated to the selected software state as indicated by the software state configuration data.

Depending on the type of memory operation, in block 430, the co-simulation interface receives data in response to the memory operation. For instance, if the memory operation was a read operation, the contents of the memory locations are received. If the operation was a write operation, then the co-simulation interface may not receive any data in response to the memory operation, or the co-simulation interface may receive an indication as to whether or not the memory operation was successful. If the memory operation was a call back operation, the response is an identifier for the callback. Using this identifier the client can then manipulate the callback performing such actions as deleting, enabling, or disabling the callback. When the specific action with which the callback is associated occurs, the callback function is executed and passes its identifier back to the client, along with other information helpful in identifying the action that has occurred. In block 440, when and if data is received by the co-simulation interface, the co-simulation interface returns the data to the client. The client may take any number of actions based on the data. In the illustrated embodiment, the client injects stimulus into the co-simulation in response to receiving the data. For example, in FIG. 1, client 155 could issue memory operations to modify one or more software variables in memory store 160 and/or apply pin signals on bus 119 or on a direct input (not shown) to hardware 117 through hardware interface 145. In alternate embodiments, the client may simply determine the symbol's current value based on the symbol type and display the value.

In block 450, if there are additional memory operation requests, the process returns to block 420. If there are no additional memory operation requests, the process ends. New requests can be made at any time during a simulation run at which point block 410 is re-entered.

Those skilled in the art will recognize that alternate embodiments of the present invention may not require all of the elements described with reference to FIGS. 2–4 or may include one or more additional elements. Those skilled in the art will also recognize that any number of known interface protocols can be used to format the various requests and responses described above, and to form the various communications channels between the hardware process and software process. Furthermore, those skilled in the art will recognize that one or more of the functions described above may be performed by various components or combinations of components within a hardware/software co-simulator, and need not be limited to the described examples.

Figure 5:
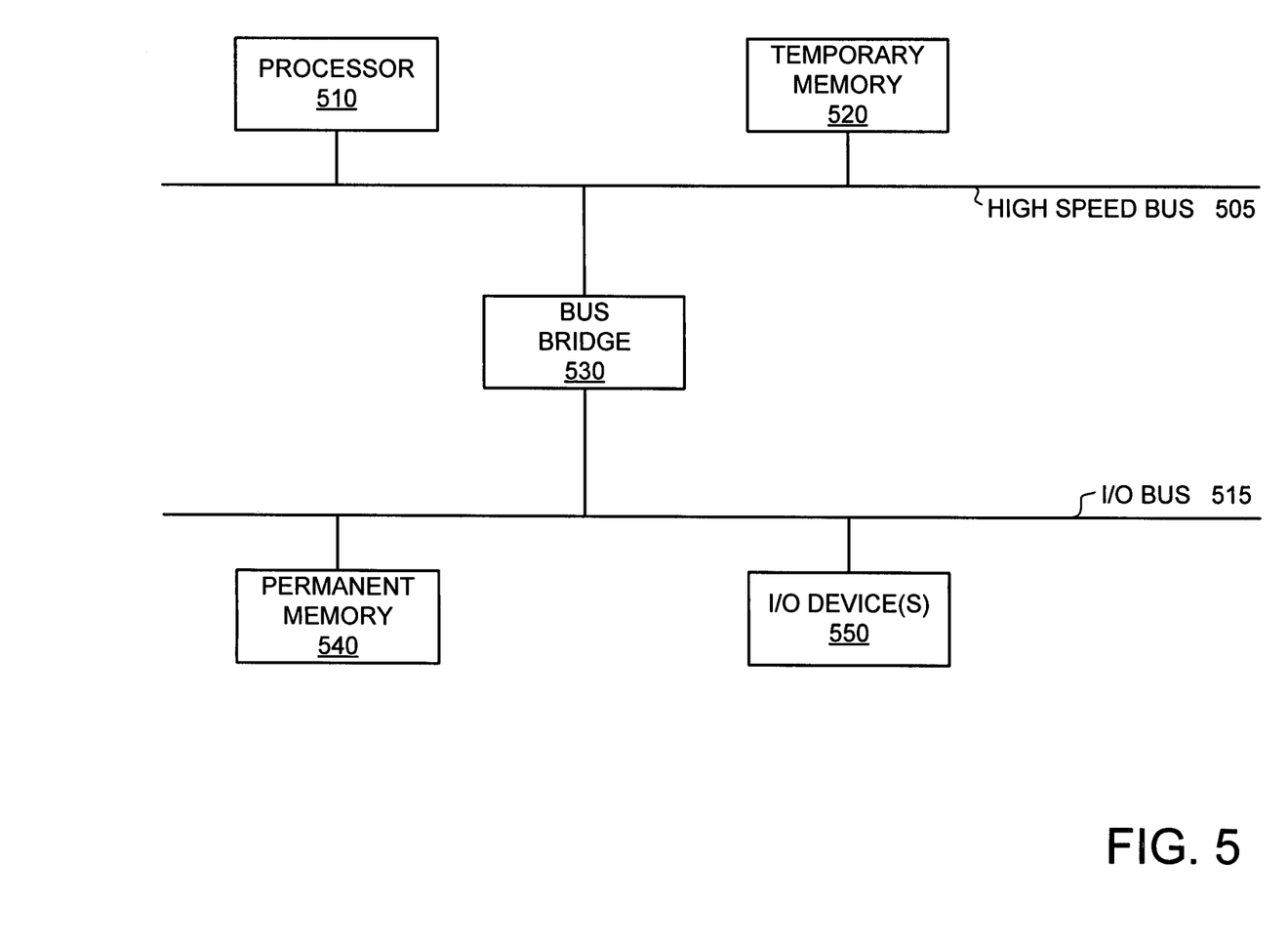
FIG. 5 illustrates one embodiment of a hardware system.

FIG. 5 illustrates one embodiment of a hardware system intended to represent a broad category of computer systems such as personal computers, workstations, and/or embedded systems. In the illustrated embodiment, the hardware system includes processor 510 coupled to high speed bus 505, which is coupled to input/output (I/O) bus 515 through bus bridge 530. Temporary memory 520 is coupled to bus 505. Permanent memory 540 is coupled to bus 515. I/O device(s) 550 is also coupled to bus 515. I/O device(s) 550 may include a display device, a keyboard, one or more external network interlaces, etc.

Certain embodiments may include additional components, may not require all of the above components, or may combine one or more components. For instance, temporary memory 520 may be on-chip with processor 510. Alternately, permanent memory 540 may be eliminated and temporary memory 520 may be replaced with an electrically erasable programmable read only memory (EEPROM), wherein software routines are executed in place from the EEPROM. Some implementations may employ a single bus, to which all of the components are coupled, or one or more additional buses and bus bridges to which various additional components can be coupled. Those skilled in the art will be familiar with a variety of alternate internal networks including, for instance, an internal network based on a high speed system bus with a memory controller hub and an I/O controller hub. Additional components may include additional processors, a CD ROM drive, additional memories, and other peripheral components known in the art.

Figure 6:
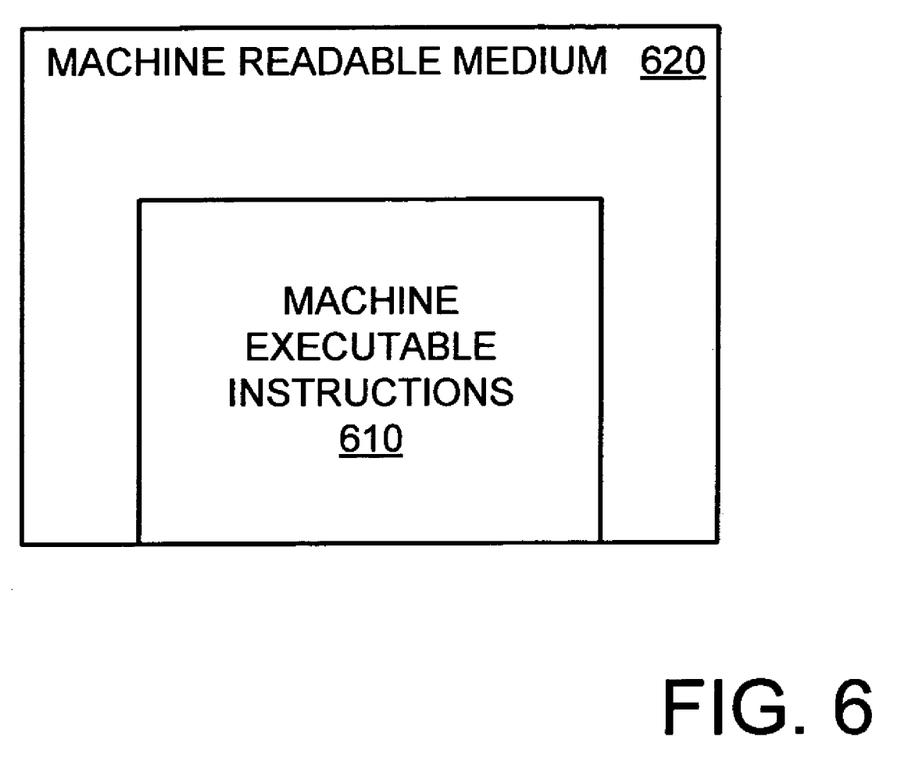
FIG. 6 illustrates one embodiment of a machine-readable medium.

In one embodiment, the hardware/software co-simulator, as described above, is implemented using one or more computers such as the hardware system of FIG. 5. Where more than one computer is used, the systems can be coupled to communicate over an external network, such as a local area network (LAN), an IP network, etc. In one embodiment, the present invention is implemented as software routines executed by one or more execution units within the computer(s). For a given computer, the software routines can be stored on a storage device, such as permanent memory 540. Alternately, as shown in FIG. 6, the software routines can be machine executable instructions 610 stored using any machine readable storage medium 620, such as a diskette, CD-ROM, magnetic tape, digital video or versatile disk (DVD), laser disk. ROM, Flash memory, etc. The series of instructions need not be stored locally, and could be received from a remote storage device, such as a server on a network, a CD ROM device, a floppy disk, etc., through, for instance, I/O device 550 of FIG. 5.

From whatever source, the instructions may be copied from the storage device into temporary memory 520 and then accessed and executed by processor 510. In one implementation, these software routines are written in the C programming language. It is to be appreciated, however, that these routines may be implemented in any of a wide variety of programming languages.

In alternate embodiments, the present invention is implemented in discrete hardware or firmware. For example, one or more application specific integrated circuits (ASICS) could be programmed with one or more of the above described functions of the hardware/software co-simulator. In another example, one or more functions of the hardware/software co-simulator could be implemented in one or more ASICs on additional circuit boards and the circuit boards could be inserted into the computer(s) described above. In another example, field programmable gate arrays (FPGAs) or static programmable gate arrays (SPGA) could be used to implement one or more functions of the present invention. In yet another example, a combination or hardware and software could be used to implement one or more functions of the present invention.

Thus, a method and apparatus for accessing state information from any process of a hardware/software co-simulation is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A method comprising:
retrieving state configuration information from a state server of a hardware/software co-simulation, the hardware/software co-simulation comprising:
simulation of at least one memory device by a logic simulator, the logic simulator comprising a memory interface model and a memory store;
simulation of a microprocessor at least in part by a first bus interface model, the simulation of the microprocessor executing software stored in the simulation of the at least one memory device;
a first kernel managing access to the memory store; and
a second kernel comprising a co-simulation manager and a memory manager;
providing a client of the hardware/software co-simulation access to a server state of the state server based on the state configuration information, wherein the state configuration information comprises memory mapping, symbol allocation, and symbol type;
registering the client with a co-simulation interface, wherein registering the client comprises assigning the client a client identifier; and
associating the client with at least one state server in the hardware/software co-simulation.

2. A method comprising:
retrieving state configuration information from a state server of a hardware/software co-simulation, the hardware/software co-simulation comprising:
simulation of at least one memory device by a logic simulator, the logic simulator comprising a memory interface model and a memory store;
simulation of a microprocessor at least in part by a first bus interface model, the simulation of the microprocessor executing software stored in the simulation of the at least one memory device;
a first kernel managing access to the memory store; and
a second kernel comprising a co-simulation manager and a memory manager;
providing a client of the hardware/software co-simulation access to a server state of the state server based on the state configuration information, wherein the state configuration information comprises memory mapping, symbol allocation, and symbol type;
registering the client with a co-simulation interface; and
associating the client with at least one state server in the hardware/software co-simulation, wherein associating the client with at least one state server comprises providing the client with a list of available state servers and one or more address spaces associated with each of the available state server.

3. The method of claim 2 wherein said client is to retain an identifier for at least one address space from the list.

4. The method of claim 2 wherein said client is to return a selection from the list and wherein associating the client with at least one state server further comprises providing the client an identifier for at least one address space from the list based on the selection.

5. A method comprising:
retrieving state configuration information from a state server of a hardware/software co-simulation, the hardware/software co-simulation comprising:
simulation of at least one memory device by a logic simulator, the logic simulator comprising a memory interface model and a memory store;
simulation of a microprocessor at least in part by a first bus interface model, the simulation of the microprocessor executing software stored in the simulation of the at least one memory device;
a first kernel managing access to the memory store; and
a second kernel comprising a co-simulation manager and a memory manager;
providing a client of the hardware/software co-simulation access to a server state of the state server based on the state configuration information, wherein the state configuration information comprises memory mapping, symbol allocation, and symbol type; and
requesting the state configuration information, said state configuration information to define at least one memory location comprising the server state, wherein requesting the state configuration information comprises:
receiving a client identifier for the client at a co-simulation interface;
receiving an identifier for an address space at the co-simulation interface, said server state being within the address space; and
issuing a request from the co-simulation interface, said request including the client identifier and the identifier for the address space.

6. The method of claim 5 wherein the request is to be serviced by the state server, said state sever to access a symbol table indicated by the identifier for the address space and to provide the state configuration information based on the symbol table.

7. The method of claim 5 where a path of the request comprises an interprocess connection and a debugger.

8. A method comprising:
retrieving state configuration information from a state server of a hardware/software co-simulation, the hardware/software co-simulation comprising:
simulation of at least one memory device by a logic simulator, the logic simulator comprising a memory interface model and a memory store;
simulation of a microprocessor at least in part by a first bus interface model, the simulation of the microprocessor executing software stored in the simulation of the at least one memory device;
a first kernel managing access to the memory store; and
a second kernel comprising a co-simulation manager and a memory manager; and
providing a client of the hardware/software co-simulation access to a server state of the state server based on the state configuration information, wherein the state configuration information comprises memory mapping, symbol allocation, and symbol type, wherein providing the client access comprises performing a memory operation on at least one memory location based on the state configuration information, wherein performing the memory operation comprises at least one of:
reading the server state;
modifying the server state;
receiving the server state at a predetermined future time; and
receiving notification upon a predetermined action on the server state.

9. A method comprising:
retrieving state configuration information from a state server of a hardware/software co-simulation, the hardware/software co-simulation comprising:
  simulation of at least one memory device by a logic simulator, the logic simulator comprising a memory interface model and a memory store;
  simulation of a microprocessor at least in part by a first bus interface model, the simulation of the microprocessor executing software stored in the simulation of the at least one memory device;
  a first kernel managing access to the memory store; and
  a second kernel comprising a co-simulation manager and a memory manager; and
providing a client of the hardware/software co-simulation access to a server state of the state server based on the state configuration information, wherein the state configuration information comprises memory mapping, symbol allocation, and symbol type, wherein providing the client access comprises performing a memory operation on at least one memory location based on the state configuration information, wherein performing the memory operation comprises:
  generating a request for the memory operation, said request including a memory allocation from the state configuration information;
  accessing a memory map; and
  issuing the memory operation to a unified memory for the hardware/software co-simulation based on the memory allocation and the memory map.

10. The method of claim 9 further comprising:
receiving data in response to the memory operation; and
interpreting the data based on a symbol type defined by the state configuration information.

11. A method comprising:
retrieving state configuration information from a state server of a hardware/software co-simulation, the hardware/software co-simulation comprising:
  simulation of at least one memory device by a logic simulator, the logic simulator comprising a memory interface model and a memory store;
  simulation of a microprocessor at least in part by a first bus interface model, the simulation of the microprocessor executing software stored in the simulation of the at least one memory device;
  a first kernel managing access to the memory store; and
  a second kernel comprising a co-simulation manager and a memory manager;
providing a client of the hardware/software co-simulation access to a server state of the state server based on the state configuration information, wherein the state configuration information comprises memory mapping, symbol allocation, and symbol type;
receiving a stimulus based on the server state; and
applying the stimulus to the hardware/software co-simulation, wherein the stimulus comprises data to be injected into the hardware/software co-simulation in response to a predetermined condition associated with the server state.

12. A method comprising:
retrieving state configuration information from a state server of a hardware/software co-simulation, the hardware/software co-simulation comprising:
  simulation of at least one memory device by a logic simulator, the logic simulator comprising a memory interface model and a memory store;
  simulation of a microprocessor at least in part by a first bus interface model, the simulation of the microprocessor executing software stored in the simulation of the at least one memory device;
  a first kernel managing access to the memory store; and
  a second kernel comprising a co-simulation manager and a memory manager; and
providing a client of the hardware/software co-simulation access to a server state of the state server based on the state configuration information, wherein the state configuration information comprises memory mapping, symbol allocation, and symbol type, wherein the memory mapping comprises a plurality of memory addresses corresponding to the server state, and wherein providing comprises:
  accessing a plurality of memory locations based on the plurality of memory addresses corresponding to the server state;
  assembling a plurality of data bits occupying the plurality of memory locations; and
  interpreting the assembly of the plurality of data bits based at least in part upon the symbol type.

13. The method of claim 1, wherein the state server comprises at least one component that contains and allows for exporting of the state configuration information to the client.

14. The method of claim 1, wherein the state server comprises a hardware process.

15. The method of claim 1, wherein the state server comprises a software process.

16. The method of claim 9, wherein the memory map maps at least one address corresponding to the simulation of the at least one memory device.

17. The method of claim 9, wherein the memory map represents a plurality of address spaces.

18. The method of claim 1, wherein the memory interface model represents input and output behavior of the at least one memory device.

19. The method of claim 1, wherein the simulation of the microprocessor comprises simulation at least in part by a first instruction set simulator.

20. The method of claim 19, wherein the first bus interface model represents input and output behavior of the simulation of the microprocessor.

21. The method of claim 19, wherein the co-simulation manager monitors transactions between the first instruction set simulator and the first bus interface model.

22. The method of claim 1, wherein the first kernel and second kernel are the same kernel.

23. The method of claim 19, wherein the hardware/software co-simulation further comprises a simulation of a digital signal processor, the digital signal processor having a corresponding address space and a corresponding symbol table.

24. The method of claim 23, wherein the simulation of the digital signal processor comprises simulation at least in part by a second instruction set simulator and a second bus interface model.

25. The method of claim 19, wherein the hardware/software co-simulation further comprises a simulation of a generic co-simulation client, the generic co-simulation client having a corresponding address space and a corresponding symbol table.

26. The method of claim 25, wherein the generic co-simulation client is simulated by a second instruction set simulator and a second bus interface model.

27. The method of claim 1, wherein the memory manager manages access to the memory store by the second kernel.

* * * * *